United States Patent
Yang et al.

(10) Patent No.: US 8,631,292 B2
(45) Date of Patent: Jan. 14, 2014

(54) MULTI-THREADING FLIP-FLOP CIRCUIT

(75) Inventors: Jianan Yang, Austin, TX (US); Gary R. Morrison, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 221 days.

(21) Appl. No.: 13/220,389

(22) Filed: Aug. 29, 2011

(65) Prior Publication Data

US 2013/0049836 A1  Feb. 28, 2013

(51) Int. Cl.
*G01R 31/28* (2006.01)

(52) U.S. Cl.
USPC .......................................... 714/733; 714/738

(58) Field of Classification Search
USPC .......................................... 714/38.1, 42, 731
See application file for complete search history.

(56) References Cited

U.S. PATENT DOCUMENTS

| | | | |
|---|---|---|---|
| 5,778,243 A * | 7/1998 | Aipperspach et al. | 712/11 |
| 5,818,273 A | 10/1998 | Orgill et al. | |
| 6,681,345 B1 * | 1/2004 | Storino et al. | 714/42 |
| 6,748,556 B1 * | 6/2004 | Storino et al. | 714/42 |
| 7,594,089 B2 * | 9/2009 | Vishin et al. | 711/168 |
| 7,653,904 B2 * | 1/2010 | Samra | 718/100 |
| 7,702,980 B2 * | 4/2010 | Chen | 714/726 |
| 7,702,992 B2 | 4/2010 | Ogawa | |
| 7,743,237 B2 | 6/2010 | Luick | |
| 7,827,454 B2 | 11/2010 | Kurimoto | |
| 7,877,655 B2 * | 1/2011 | Le et al. | 714/729 |

* cited by examiner

*Primary Examiner* — Esaw Abraham
(74) *Attorney, Agent, or Firm* — Mary Jo Bertani; James L. Clingan, Jr.

(57) ABSTRACT

A flip-flop circuit includes a master latch, a master/slave gate, a slave latch, a slave gate, a feedback latch, and a master gate. The master latch has an input and an output. The master/slave gate has an input coupled to the output of the master latch and an output. The slave latch has input coupled to the output of the master/slave gate and an output. The slave gate has input coupled to the output of the slave latch and an output. The has an input coupled to the output of the slave gate and an output. The master gate has an input coupled to the output of the feedback latch and an output coupled to the input of the master latch.

19 Claims, 5 Drawing Sheets

MULTI-THREADING FLIP-FLOP CIRCUIT

BACKGROUND

1. Field

This disclosure relates generally to computer processing systems, and more specifically, to flip-flop circuits for multi-threading processing systems.

2. Related Art

It is often desirable to have the capability to run a logic built-in self-test (LBIST) or provide other functionality on a processor without interrupting normal operation from the perspective of a user. As processors with the capability to execute multiple threads are developed, switching between threads is often relatively time-consuming. For example, trying to run LBIST with one or more other threads on a processor may cause unacceptable delays or interruptions in normal, functional operation during the switch.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of processing systems disclosed herein provide an enhanced flip-flop circuit for multi-threading. The topology of the enhanced flip-flop circuits includes a feed back latch circuit in addition to a master latch and a slave latch. A control signal is added to enable swap operations between latch circuits. Additional components are added to the master latch to remove contention issues between the latches. The flip-flop circuits enable very fast swapping of data when switching between multiple threads, and can also be used to enable a faster version of checkpoint/restore capability than currently available with traditional systems.

Figure 1:
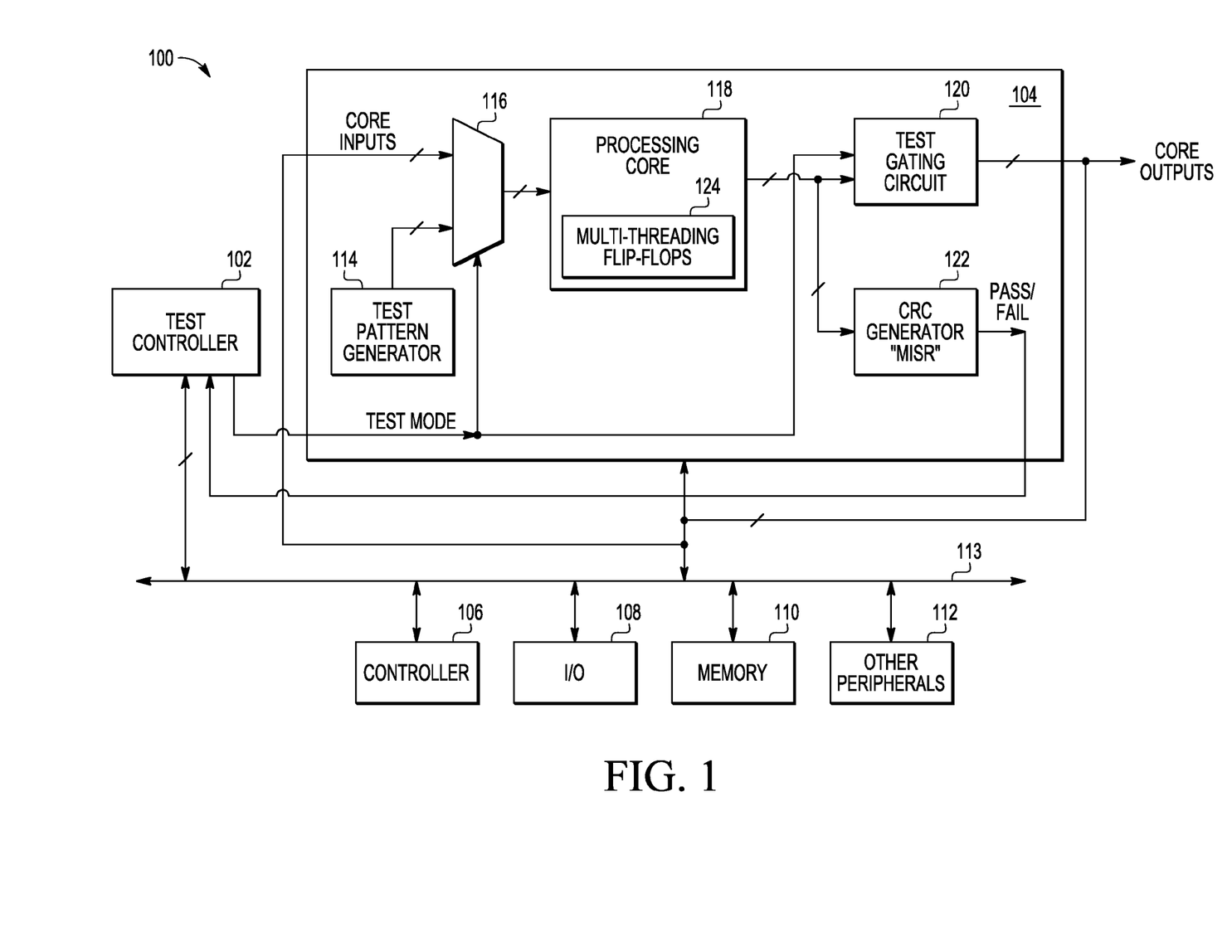
FIG. 1 is a block diagram of an embodiment of a processing system.

FIG. 1 is a block diagram of an embodiment of a processing system 100 including test controller 102, processor 104, controller 106, input/output (I/O) handlers/interfaces 108, memory 110, and other peripheral devices or modules 112 which are bi-directionally coupled to bus 113 to allow communication between components. For performing LBIST, processor 104 can include test pattern generator 114, multiplexer 116, processor core 118, test gating circuit 120, and cyclic redundancy check (CRC) logic 122. Processor core 118 can include multi-threading flip-flop circuits 124. Other components can be included in processing system 100.

Test controller 102 provides a test mode indicator to multiplexer 116, and to receive test pass/fail indicator(s) from CRC generator 122. Test mode indicator indicates whether test mode has been enabled. For example, test mode may be enabled to test the functionality of processor core 118 while processor core 118 is executing one or more other threads. Processor core 118 can switch between functional and test threads with very little overhead. Most processor cores have a certain percentage of inherently inoperable clock cycles during functional execution. With very low overhead to switch to and from an LBIST thread, much of these inoperable clock cycles can be recovered for testing purposes. Multiplexer 116 uses the test mode indicator to determine whether to provide non-test-related input from other components in system 100 or test-related input as provided by test pattern generator 114 to processor core 118. Test pattern generator 114 may be implemented as a pseudo-random pattern generator (PRPG) based upon a linear feedback shift register, or other suitable test pattern generator.

Test gating circuit 120 receives the test mode indicator and outputs from processor core 118. If the test mode indicator indicates that processor core 118 is being tested, test gating circuit 120 prevents the test output or results from processor core 118 from affecting components of system 100 that are external to processor 104. If the test mode indicator indicates that processor core 118 is not in test mode, then the output from processor core 118 passes through test gating circuit 120 and is available to other components in processing system 100.

CRC generator 122 also receives output from processor core 118 to determine whether data output from processor core 118 is corrupted or inaccurate. If CRC generator 122 detects an anomaly in the output from processor core 118, the pass/fail indicator is set to indicate a failure. Otherwise, CRC generator 122 sets the pass/fail indicator to indicate that the test passed. CRC generator 122 can be implemented using a linear shift feedback register or other suitable CRC circuit or other kinds of checking logic.

Bus 113 may communicate external to computer processing system 100. Alternate embodiments of the present disclosure may use more, less, or different components and functional blocks that those illustrated in FIG. 1. As some possible examples, alternate embodiments of computer processing system 100 may include cache memory units, a memory management unit (MMU), a direct memory access (DMA) controller, a timer, a serial peripheral interface, a digital-to-analog converter, an analog-to digital converter, a driver (e.g. a liquid crystal display driver), and/or a plurality of other types of memory.

In alternate embodiments, computer processing system 100 may include one, two, or any number of processors 104. One processor, for example, may monitor flaws in another processor, as indicated by CRC errors, so as to avoid the unreliability of a flawed processor monitoring itself. If a plurality of processors 104 are used in computer processing system 100, any number of them may be the same, or may be different. Note that although computer processing system 100 may have a plurality of processors 104, a single processor 104 which by itself can execute a plurality of instruction sets.

Memory module 110 can include a multi-level cache architecture including one or more levels of instruction cache and data cache module that have slower access rates than Level 1 cache modules, which are typically integrated with processor core 118. Memory 110 can also include an external memory that is also referred to as a main memory and can optionally include additional devices such as buffers and the like.

Figure 2:
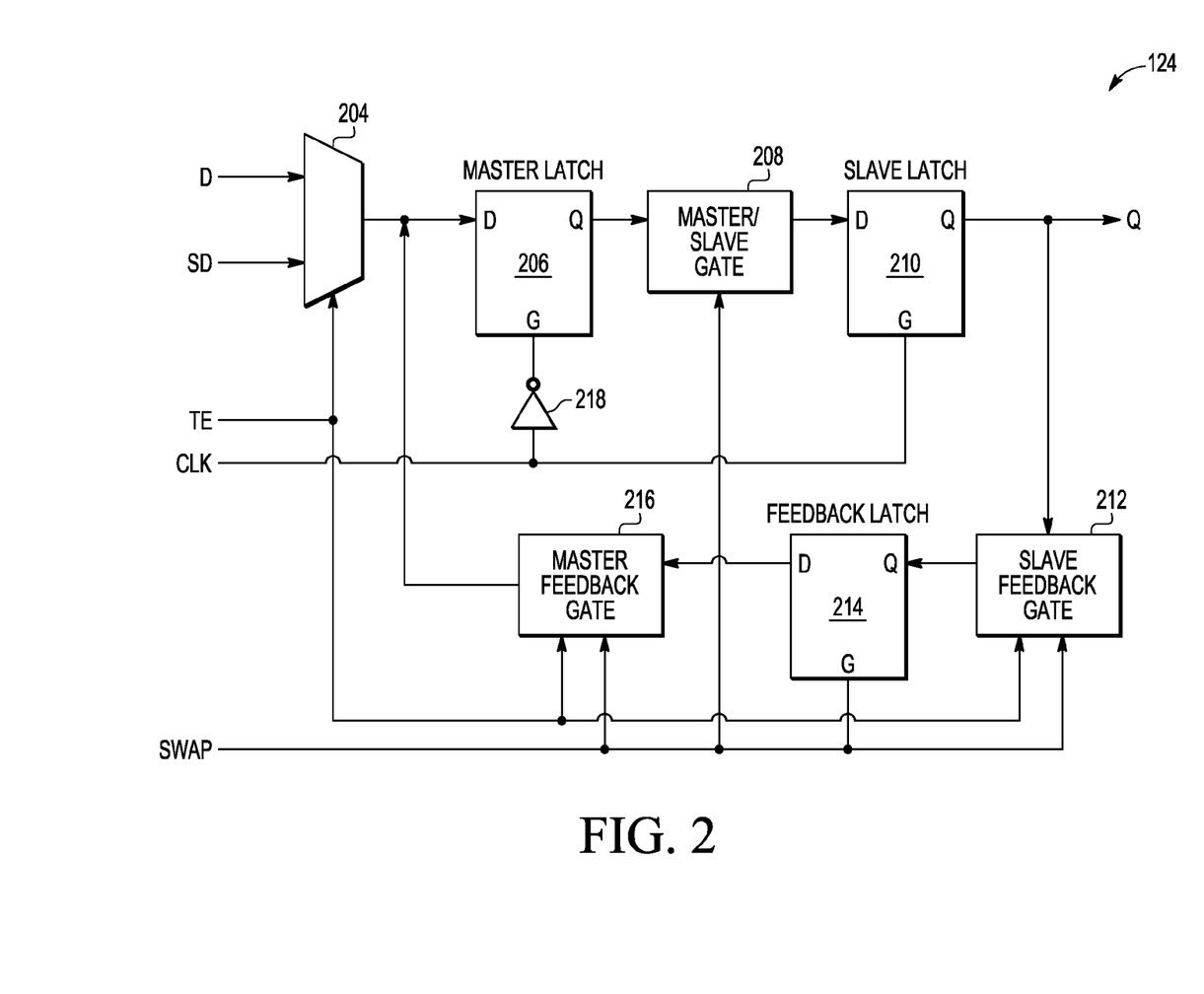
FIG. 2 is a conceptual block diagram of an embodiment of a multi-threading flip-flop circuit that may be used in the processing system of FIG. 1.

FIG. 2 is a conceptual block diagram of an embodiment of a multi-threading flip-flop circuit 124 that may be used in the processing system 100 of FIG. 1 that includes scan multiplexer 204, master latch 206, master/slave gate 208, slave latch 210, slave feedback gate 212, feedback latch 214, and master feedback gate 216. A first input to scan multiplexer 204 receives data (D) from a first thread and a second input to scan multiplexer 204 receives scan data (SD) from a second thread. Second-thread data could alternatively come from the data (D) input, such as when the flip-flop switches between two functional threads, rather than between functional and LBIST threads. In the embodiment shown, however, the first thread uses functional data from the data (D) input, and the second thread uses test data from the scan data (SD) input. A test enable (te) signal is provided to multiplexer 204 to select between data from the first, functional thread or second, LBIST thread. In other embodiments, the test enable or other suitable signal may be used to indicate when the processor is switching from execution of one thread to another thread (e.g., a context switch) rather than switching from executing a first thread to LBIST mode. Additionally, although test scan data is used herein as an example of data that may be used by LBIST or other second thread, other suitable data for a thread may be used.

An output signal from scan multiplexer 204 is provided to master latch 206. An output signal from master latch 206 is provided to master/slave gate 208. A clock signal (CLK) passes through inverter 218 before being provided as a control input (G) to master latch 206.

Master/slave gate 208 receives a swap signal and a clock signal (CLK), and provides a data signal (D) to slave latch 210. The swap signal and the clock signal determine whether data propagates to slave latch 210.

Slave latch 210 receives the clock signal (CLK) as a control input and outputs data (Q) to feedback latch 214 when allowed by slave feedback gate 212.

Slave feedback gate 212 receives the swap signal and the test enable (te) signal. that determine whether data is output from slave feedback gate 212 to feedback latch 214.

Feedback latch 214 receives a control input (G) from the swap signal, which helps feedback latch 214 to retain data when swap is disabled.

Master feedback gate 216 receives the test enable (te) signal and the swap signal that determine whether data from feedback latch 214 is provided to the input of the master latch 206.

Figure 3:
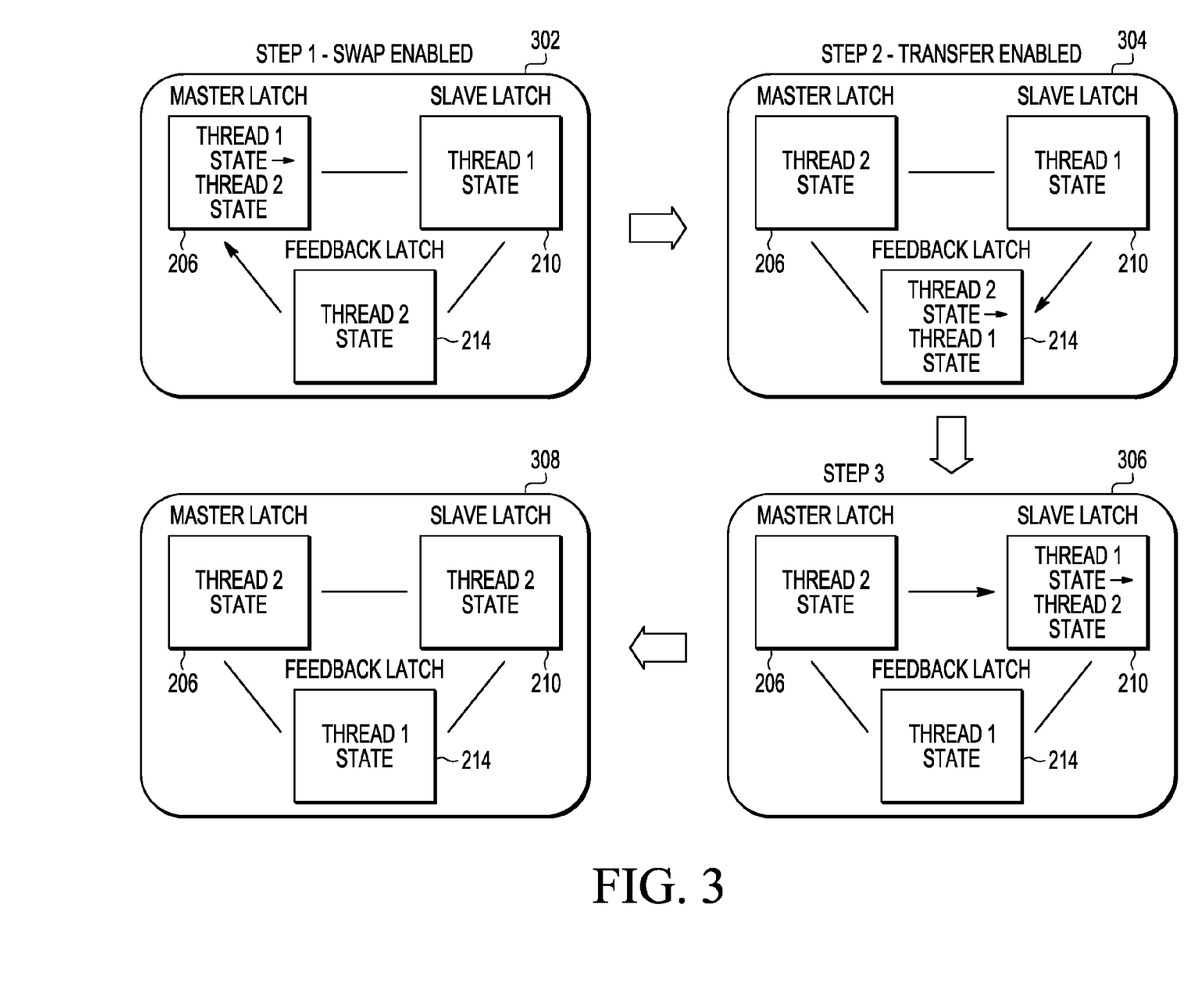
FIG. 3 is a series of state diagrams showing an example of how the multi-threading flip-flop circuit of FIG. 3 can be used to facilitate execution of multiple threads.

Operation of multi-threading flip flop circuit 124 is now described with reference to FIGS. 2 and 3. FIG. 3 shows an example of how the multi-threading flip-flop circuit of FIG. 2 can be used to rapidly swap between multiple threads in a series of state diagrams 302-308. In state diagram 302, master latch 206 is initially storing thread 1 state, slave latch 210 is storing thread 1 state, and feedback latch 214 is storing thread 2 state. When clock signal (CLK) is high and swap signal switches to high, thread 2 state is transferred from feedback latch 214 to master latch 206.

In state diagram 304, thread 1 state from slave latch 210 transfers to feedback latch 214 when the test enable (te) signal goes high.

In state diagram 306, thread 2 state from master latch 206 transfers to slave latch 210 when swap signal goes low. State diagram 308 shows the final state of the latch circuits after the transfer or swap is completed, specifically, master latch 206 and slave latch 210 both contain thread 2 state, and feedback latch 214 contains thread 1 state.

Figure 4:
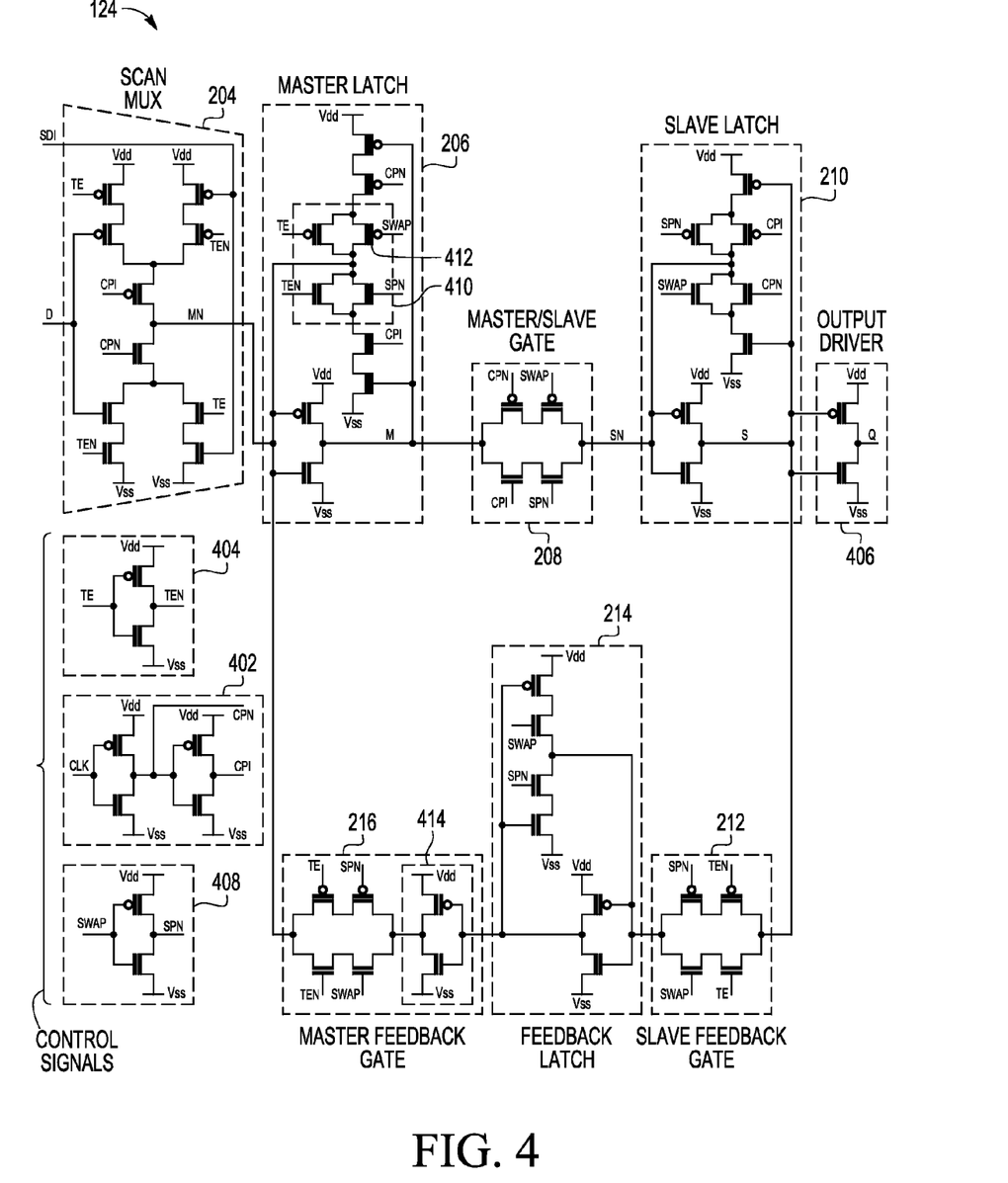
FIG. 4 is a schematic diagram of an embodiment of a multi-threading flip-flop circuit that can be used in the processing core of FIG. 1.
Figure 5:
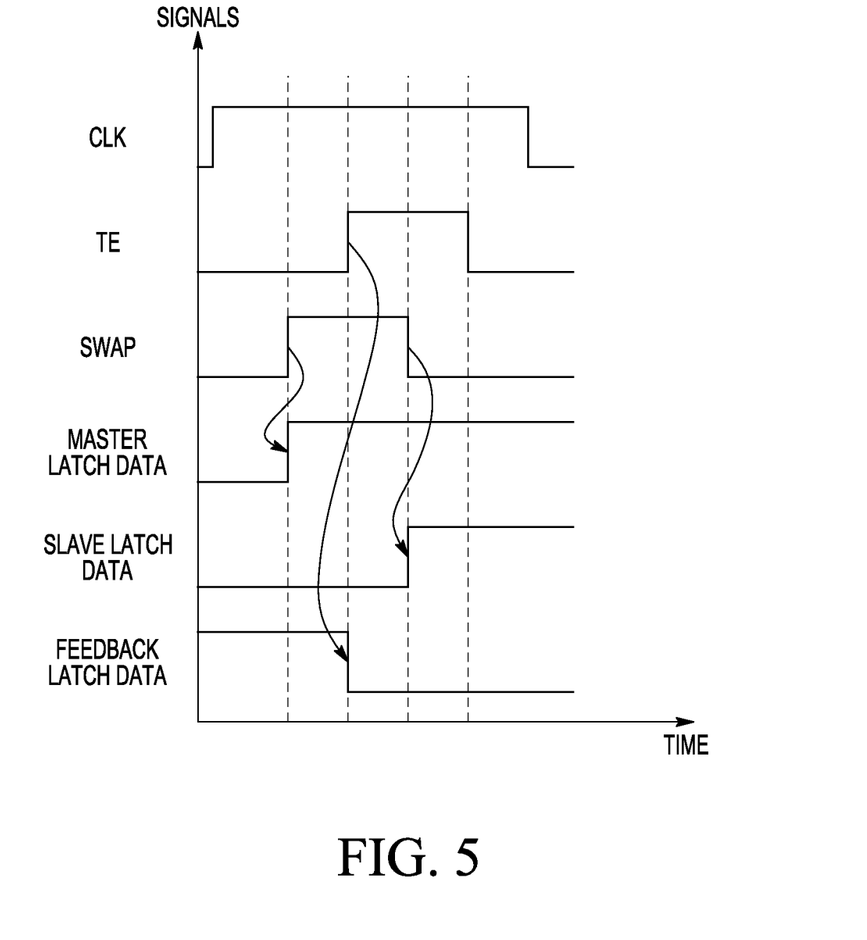
FIG. 5 is an example of a timing diagram for various control signals used in the operation of an embodiment of the multi-threading flip-flop circuit of FIG. 3.

Referring to FIGS. 4 and 5, FIG. 4 is a schematic diagram of an embodiment of a multi-threading flip-flop circuit 124 that can be used in the processor core 118 of FIG. 1 including scan multiplexer 204, master latch 206, master/slave gate 208, slave latch 210, output driver 406, slave feedback gate 212, feedback latch 214, master feedback gate 216, and control signal generators 402, 404, 408, feedback circuit 410, and disable circuit 412, inverting buffer 414. FIG. 5 is an example of a timing diagram for various control signals used in the operation of an embodiment of the multi-threading flip-flop 124 circuit of FIG. 4.

Flip-flop circuit 124 performs a swap operation in which data stored in feedback latch 214 is transferred to and stored in master latch 206. Data stored in slave latch 210 is transferred to and stored in feedback latch 214. Then, the data stored in master latch 206 is transferred to and stored in slave latch 210.

Control signal generators 402, 404, 408 include clock signal generator 402, test enable signal generator 404, and swap enable signal generator 408. Clock signal generator 402 includes a first static CMOS inverter circuit that receives a system clock signal (ck) and outputs clock enable signal (CPN) and a second inverter circuit that receives the clock enable signal (CPN) and outputs an inverse clock enable signal (CPI). Test enable signal generator 404 includes a static CMOS inverter circuit that receives a test enable signal (te) and outputs a test enable signal (TEN). Swap enable signal generator 408 includes a static CMOS inverter circuit that receives the swap signal (swap) and outputs a swap signal (SPN).

Master/slave gate 208 receives CPN and CPI signals at respective control gates of one set of opposing transistors, and swap and SPN signals at the control gates of another set of opposing transistors. Master/slave gate 208 allows data to transfer from master latch 206 to slave latch 210 when the CPN and swap signals are high, as shown by the signal timing diagram of FIG. 5.

Slave feedback gate 212 receives TEN and te signals at respective control gates of one set of opposing transistors, and swap and SPN signals at the control gates of another set of opposing transistors. Slave feedback gate 208 allows data to transfer from slave latch 210 to feedback latch 214 when the te and swap signals are high, as shown by the signal timing diagram of FIG. 5.

Signals output from control signal generators 402, 404, and 408 whose names end with "N" (CPN, SPN and TEN) are therefore inverted-sense, buffered versions of their corresponding inputs (ck, swap, and te, respectively). CPI in turn has the same sense as the original cp signal.

Master feedback gate 216 includes an inverting buffer 414 coupled to two sets of opposing transistors that receive TEN and te signals at respective control gates of one set of opposing transistors, and swap and SPN signals at the control gates of another set of opposing transistors. Master feedback gate 216 allows data to transfer from feedback latch 214 to master latch 206 when the TEN and swap signals are high, as shown by the signal timing diagram of FIG. 5.

Feedback circuit 410 is coupled between an output and an input of master latch 206. Feedback circuit 410 includes disable circuit 412 that decouples feedback circuit 410 from the input of the master latch 206 in response to the swap operation being enabled. In some embodiments, disable circuit 412 includes a first transistor coupled to the swap signal, which indicates that the flip-flop circuit 124 is to perform the swap operation. Disable circuit 412 can also include a second transistor coupled to the test enable signal.

Disable circuit 412 can include a transistor that becomes non-conductive in response to the swap signal being asserted to enable data to be transferred to master latch 206. Master/slave gate 208 couples the output of master latch 206 to the input of slave latch 210 at termination of the swap operation. Feedback latch 214 receives data from the slave latch 210 during the swap operation. Slave latch 210 latches received data at the input of slave latch 210 after the termination of the swap operation. Feedback latch 214 latches data from slave latch 210 at the termination of the swap operation.

In other embodiments, a method of executing a first thread and a second thread includes storing a last state of the second thread in a feedback latch 214, running the first thread using a feedback latch 214, and switching from running the first thread to running the second thread by loading the last state of the second thread from the feedback latch 214 into a master latch 206. A current state of the first thread is loaded from a slave latch 210 into the feedback latch 214, and the last state of the second thread is loaded from the master latch 206 into the slave latch 210. The second thread executes using data from the feedback latch 214.

The current state of the first thread is a last state of the first thread. Flip-flop circuit 124 switches from running the second thread through the feedback latch 214 to running the first thread through the feedback latch 214 by loading the last state of the first thread from the feedback latch 214 into the master latch 206, loading a current state of the second thread from the slave latch 210 into the feedback latch 214, and loading the last state of the first thread from the master latch 206 to the slave latch 210. The first thread then executes using data from the feedback latch 214.

The first thread and a second thread are timed by a clock that switches between a first logic state during a first portion of a cycle of the clock and a second logic state during a second portion of the cycle of the clock. Switching from running the first thread to running the second thread begins and ends during a swap operation which begins and ends during a single portion of the clock cycle.

The last state of the second thread is loaded into the master latch 206 using a feedback circuit coupled between the output of the master latch 206 and the input of the master latch 206. The feedback circuit comprises a disable circuit for decoupling the feedback circuit from the input of the master latch 206 in response to the swap operation being enabled.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By now it should be appreciated that there has been provided an embodiment of a flip-flop circuit that can include a first latch 206 having an input and an output; a second latch 210 having an input coupled to the output of the first latch 206; and a third latch 214 having an input coupled to the output of the second latch 210 and an output coupled to the input of the first latch 206.

In some aspects, the first latch 206 is a master latch, the second latch 210 is a slave latch, and the third latch 214 is a feedback latch. The flip-flop further includes a master/slave gate 208 between the input coupled between the master latch and the slave latch having an input coupled to the output of the master latch and an output coupled to the input of the slave latch; a slave gate 212 coupled between the slave latch and the feedback latch having an input coupled to the output of the slave latch and an output coupled to the input of the feedback latch; and a master gate 216 coupled between the feedback latch and the master latch having an input coupled to the output of the feedback latch and an output coupled to the input of the master latch.

In other aspects, the flip-flop circuit has a swap operation in which data stored in the feedback latch (214) is coupled to the master latch (206) and stored in the master latch and data stored in the slave latch (210) is coupled to the feedback latch (214) and stored in the feedback latch.

In still other aspects, the master latch (206) comprises a feedback circuit (410) coupled between the output of the master latch and the input of the master latch, wherein the feedback circuit comprises a disable circuit (412) for decoupling the feedback circuit from the input of the master latch in response to the swap operation.

In further aspects, the disable circuit (412) comprises a decoupling transistor (transistor with gate receiving SWAP) coupled to a swap signal, wherein the swap signal indicates that the flip-flop circuit is to perform the swap operation.

In further aspects, the decoupling transistor becomes non-conductive in response to the swap signal.

In further aspects, the master/slave gate (208) couples the output of the master latch to the input of the slave latch at termination of the swap operation.

In further aspects, the master latch (206) latches the output of the master latch at the termination of the swap operation.

In further aspects, the slave latch (210) latches the data at the input of the slave latch in response to a clock signal after the termination of the swap operation.

In further aspects, the feedback latch (214) receives the data from the slave latch (210) during the swap operation.

In another embodiment, a method of running a first thread and a second thread, can include storing a last state of the second thread in a feedback flip-flop 214; running the first thread using a master/slave flip-flop 124; switching from running the first thread through the master/slave flip-flop 214 to running the second thread through the master/slave flip-flop 124 by: loading the last state of the second thread from the feedback latch 214 into a master latch 206 of the master/slave flip-flop; loading a current state of the first thread from a slave latch 210 of the master/slave flip-flop into the feedback latch 214; and loading the last state of the second thread from the master latch 206 into the slave latch 210; and running the second thread using the master/slave flip-flop 208.

In further aspects, one of a group consisting of the first thread and the second thread comprises a test program.

In further aspects, the current state of the first thread becomes a last state of the first thread, and the method can further include: switching from running the second thread through the master/slave flip-flop 124 to running the first thread through the master/slave flip-flop 124 by: loading the last state of the first thread from the feedback latch 214 into the master latch 206; loading a current state of the second thread from the slave latch 210 into the feedback latch 214; and loading the last state of the first thread from the master latch 206 to the slave latch 210; and running the first thread using the master/slave flip-flop 124.

In further aspects, the running of the first thread and a second thread is timed by a clock that switches between a first logic state during a first portion of a cycle of the clock and a second logic state during a second portion of the cycle of the clock, wherein the switching from running the first thread to running the second thread begins and ends during a swap operation which begins and ends during a single first portion of the cycle of the clock.

In further aspects, the loading of the last state of the second thread into the master latch 206 is further characterized by the master latch 206 comprising a feedback circuit 410 coupled between the output of the master latch 206 and the input of the master latch 206, wherein the feedback circuit 410 comprises a disable circuit 412 for decoupling the feedback circuit 410 from the input of the master latch 206 in response to the swap operation.

In further aspects, the loading of the last state of the second thread into the master latch 206 is further characterized by the disable circuit 412 comprising a decoupling transistor coupled to a swap signal, wherein the swap signal indicates that the flip-flop circuit is to perform the swap operation.

In further aspects, the loading of the last state of the second thread into the master latch 206 is further characterized by the decoupling transistor becomes non-conductive in response to the swap signal.

In other embodiments, a processing system for running a first thread and a second thread can comprise: a master/slave flip-flop 124 having an input for receiving a current portion of the first thread in a first mode and a current portion of the second thread in a second mode, a master latch 206 having an input as the input of the master/slave flip-flop 124, and a slave latch 210 having an output as an output of the master/slave flip-flop 124; and a feedback latch 214 having contents of a last state of the first thread if the second thread is running and a last state of the first thread if the second thread is running and, during a transition between the first and second modes, coupling its contents to the master latch 206 followed by storing contents of the slave latch 210.

In further aspects, the master/slave flip-flop 124 is further characterized as coupling, during the transition between the first and second modes, the contents received from the feedback latch 214 from the master latch 206 to the slave latch 210.

In further aspects, the master latch 206 comprises a feedback circuit 410 coupled between the output of the master latch 206 and the input of the master latch 206, wherein the feedback circuit 410 comprises a disable circuit 412 for decoupling the feedback circuit 410 from the input of the master latch 206 in response to the swap operation; and the disable circuit 412 comprises a decoupling transistor coupled to a swap signal, wherein the swap signal indicates that the flip-flop circuit is to perform the swap operation.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

The term "program" or "thread", as used herein, is defined any sequence of bit values such as indicated by the circuit-level implementation or manifestation of a test pattern such as an LBIST test, or that of a programmatic subroutine, function, procedure, object method, object implementation, executable application, applet, servlet, source code, object code, shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of processing system 100 are circuitry located on a single integrated circuit or within a same device. Alternatively, processing system 100 may include any number of separate integrated circuits or separate devices interconnected with each other. For example, memory 35 may be located on a same integrated circuit as masters 12 and 14 or on a separate integrated circuit or located within another peripheral or slave discretely separate from other elements of processing system 100. Peripheral 18 and I/O circuitry 16 may also be located on separate integrated circuits or devices. Also for example, processing system 100 or portions thereof may be soft or code representations of physical circuitry or of logical representations convertible into physical circuitry. As such, processing system 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, processing system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A flip-flop circuit, comprising:
   a master latch having an input and an output;
   a slave latch having an input coupled to the output of the master latch; and
   a feedback latch having an input coupled to the output of the slave latch and an output coupled to the input of the master latch;
   a master/slave gate between the input coupled between the master latch and the slave latch having an input coupled to the output of the master latch and an output coupled to the input of the slave latch;
   a slave gate coupled between the slave latch and the feedback latch having an input coupled to the output of the slave latch and an output coupled to the input of the feedback latch; and
   a master gate coupled between the feedback latch and the master latch having an input coupled to the output of the feedback latch and an output coupled to the input of the master latch.

2. The flip-flop of claim 1, wherein the flip-flop circuit has a swap operation in which data stored in the feedback latch is coupled to the master latch and stored in the master latch and data stored in the slave latch is coupled to the feedback latch and stored in the feedback latch.

3. The flip-flop circuit of claim 2, wherein the master latch comprises a feedback circuit coupled between the output of the master latch and the input of the master latch, wherein the feedback circuit comprises a disable circuit for decoupling the feedback circuit from the input of the master latch in response to the swap operation.

4. The flip-flop of claim 3, wherein the disable circuit comprises a decoupling transistor coupled to a swap signal, wherein the swap signal indicates that the flip-flop circuit is to perform the swap operation.

5. The flip-flop of claim 4, wherein the decoupling transistor becomes non-conductive in response to the swap signal.

6. The flip-flop of claim 2, wherein the master/slave gate couples the output of the master latch to the input of the slave latch at termination of the swap operation.

7. The flip-flop of claim 6, wherein the master latch latches the output of the master latch at the termination of the swap operation.

8. The flip-flop of claim 7, wherein the slave latch latches the data at the input of the slave latch in response to a clock signal after the termination of the swap operation.

9. The flip-flop of claim 8, wherein the feedback latch receives the data from the slave latch during the swap operation.

10. A method of running a first thread and a second thread, comprising:
    storing a last state of the second thread in a feedback latch;
    running the first thread using a master/slave latch;
    switching from running the first thread through the master/slave flip-flop to running the second thread through the master/slave flip-flop by:
      loading the last state of the second thread from the feedback latch into a master latch of the master/slave flip-flop;
      loading a current state of the first thread from a slave latch of the master/slave flip-flop into the feedback latch; and
      loading the last state of the second thread from the master latch into the slave latch; and
    running the second thread using the master/slave flip-flop.

11. The method of claim 10, wherein one of a group consisting of the first thread and the second thread comprises a test program.

12. The method of claim 10, whereby the current state of the first thread becomes a last state of the first thread, further comprising:
    switching from running the second thread through the master/slave flip-flop to running the first thread through the master/slave flip-flop by:
      loading the last state of the first thread from the feedback latch into the master latch;

loading a current state of the second thread from the slave latch into the feedback latch; and loading the last state of the first thread from the master latch to the slave latch; and running the first thread using the master/slave flip-flop.

13. The method of claim 10, wherein the running of the first thread and a second thread is timed by a clock that switches between a first logic state during a first portion of a cycle of the clock and a second logic state during a second portion of the cycle of the clock, wherein the switching from running the first thread to running the second thread begins and ends during a swap operation which begins and ends during a single first portion of the cycle of the clock.

14. The method of claim 13, wherein the loading of the last state of the second thread into the master latch is further characterized by the master latch comprising a feedback circuit coupled between the output of the master latch and the input of the master latch, wherein the feedback circuit comprises a disable circuit for decoupling the feedback circuit from the input of the master latch in response to the swap operation.

15. The method of claim 14, wherein the loading of the last state of the second thread into the master latch is further characterized by the disable circuit comprising a decoupling transistor coupled to a swap signal, wherein the swap signal indicates that the flip-flop circuit is to perform the swap operation.

16. The method of claim 15, wherein the loading of the last state of the second thread into the master latch is further characterized by the decoupling transistor becomes non-conductive in response to the swap signal.

17. A processing system for running a first thread and a second thread, comprising:

a master/slave flip-flop having an input for receiving a current portion of the first thread in a first mode and a current portion of the second thread in a second mode, a master latch having an input as the input of the master/slave flip-flop, and a slave latch having an output as an output of the master/slave flip-flop; and a feedback latch having contents of a last state of the first thread if the second thread is running and a last state of the first thread if the second thread is running and, during a transition between the first and second modes, coupling the contents of the feedback latch to the master latch followed by storing contents of the slave latch.

18. The system of claim 17, wherein the master/slave flip-flop is further characterized as coupling, during the transition between the first and second modes, the contents received from the feedback latch from the master latch to the slave latch.

19. The system of claim 17, wherein:

the master latch comprises a feedback circuit coupled between the output of the master latch and the input of the master latch, wherein the feedback circuit comprises a disable circuit for decoupling the feedback circuit from the input of the master latch in response to the swap operation; and the disable circuit comprises a decoupling transistor coupled to a swap signal, wherein the swap signal indicates that the flip-flop circuit is to perform the swap operation.

* * * * *